United States Patent [19]

Bauer

[11] Patent Number: 4,954,869
[45] Date of Patent: Sep. 4, 1990

[54] MOS-CONTROLLED THYRISTOR (MCT)

[75] Inventor: Friedhelm Bauer, Würenlingen, Switzerland

[73] Assignee: Asea Brown Boveri Ltd., Baden, Switzerland

[21] Appl. No.: 318,154

[22] Filed: Mar. 2, 1989

[30] Foreign Application Priority Data

Mar. 10, 1988 [CH] Switzerland .............. 903/88

[51] Int. Cl.$^5$ ............................ H01L 29/74
[52] U.S. Cl. ..................... 357/38; 357/39; 357/15
[58] Field of Search ............... 357/15, 38, 39

[56] References Cited

U.S. PATENT DOCUMENTS 4,359,486 11/1982 Patalong et al. ............... 357/15
4,758,871 7/1988 Herberg ........................ 357/38

FOREIGN PATENT DOCUMENTS 0199293 10/1986 European Pat. Off. .
3330022 2/1985 Fed. Rep. of Germany ........ 357/38
2124428 2/1984 United Kingdom .

OTHER PUBLICATIONS

B. J. Baliga, et al., IEEE Int. Electron Dev. Meet. Techn. Dig., pp. 264–267 (1982).
J. P. Russell, et al., IEEE Electron Dev. Lett., vol. EDL-4, pp. 63–65 (1983).
V. A. K. Temple, IEEE Trans. Electron Dev., vol. ED-33, pp. 1609–1618 (1986).
M. Stoisiek, et al., IEEE Int. Electron Dev. Meet. Techn. Dig., pp. 158–161 (1985).
M. Stoisiek, et al., Advances in Solid State Physics, vol. 26, pp. 361–373, F. Vieweg & Sons, Braunschweig/Wiesbaden (1986).
C. Turchetti, et al., IEEE Trans. Electron Dev., vol. ED-32, pp. 773–782 (1985).
S. E. Swirhun, et al., IEEE Trans. Electron Dev., vol. ED-32, pp. 194–202 (1985).
Siemens Forschungs–und Entwicklungsberichte, vol. 14, No. 2, 1985 (Berlin, DE), M. Stoisiek, et al., pp. 45–49.

Primary Examiner—Rolf Hille
Assistant Examiner—Steven Loke
Attorney, Agent, or Firm—Oblon, Spivak, McClelland, Maier & Neustadt

[57] ABSTRACT

In an n-channel MCT (MOS-controlled thyristor), the p-doped channel region and the n+-doped drain region are replaced by an n-doped combined channel-drain region (13) in the MOSFET structure of the switchable cathode short-circuits.

The resulting MOSFET structure of the depletion type results in latch-up immunity for the component and makes possible a simple optimization of the current level which can be switched off as a maximum.

4 Claims, 1 Drawing Sheet 4,954,869

MOS-CONTROLLED THYRISTOR (MCT)

BACKGROUND OF THE INVENTION

1. Field of the Invention

The present invention relates to the field of power electronics. It relates in particular to an MOS-controlled thyristor (MCT) having an anode and a cathode, comprising

- a sequence of variously doped layers containing a p-type emitter layer, an n-type base layer, a p-type base layer and an n-type emitter layer between the anode and the cathode; and
- a plurality of cathode short-circuits on the cathode side which can each be controlled via a MOSFET structure having a source region, a channel region, a drain region and an insulated gate electrode and which short-circuit the p-type base layer to a cathode contact in the switched-on state;
- the p-type base layer being connected to the drain region via a drain contact and the source region being a part of the n-type emitter layer which is in communication with the cathode contact.

Such a thyristor is known, for example, from the paper by M. Stoisiek et al., IEEE Int. Electron Dev. Meet. Techn. Dig., pages 158–161 (1985).

DISCUSSION OF BACKGROUND

Field-effect-controlled bipolar power semiconductor components are increasingly acquiring importance in power electronics because they combine the low on-state resistance typical of bipolar components with the wattless control of the conductivity of a semiconductor surface via an insulated gate electrode.

A first representative of such components for applications above 500 V has already established itself with the IGT (Insulated Gate Transistor) (on this point see: B. J. Baliga et al., IEEE Int. Electron Dev. Meet. Techn. Dig., pages 264–267 (1982); or: J. P. Russell et al., IEEE Electron Dev. Lett., EDL-4, pages 62–65 (1983)).

These novel components for the 1000 V class receive considerable attention on the part of circuit development engineers because particularly simple, and therefore low-price, drive circuits can be achieved with them.

Instead of the transistor structure, a thyristor structure in which cathode short-circuits can be switched across MOSFET structures is suitable for still higher voltages.

Such MOS-controlled thyristors or MCTs (MOS Controlled Thyristors) have already been proposed on several occasions (V.A.K. Temple, IEEE Trans. Electron Dev., ED-33, pages 1609–1618 (1986), or the publication cited in the introduction).

The simplest MCT with switch-off facility uses a DMOS-Like p-channel elementary cell (see FIG. 8 in the paper by V.A.K. Temple). Owing to the comparatively low mobility of holes in inversion layers (the ratio of the mobility between p-channel and n-channel MOSFET is about 1:3), a p-channel MCT is able, however, to switch off a maximum of only one third of the current density of a comparable n-channel MCT.

An n-channel MCT can be achieved as in CMOS technology by building up a structure complementary to the p-channel MCT (see FIG. 2 in the paper by V.A.K Temple). For this purpose, however, an epitaxially grown substrate material is necessary. However, all the important advantages which the use of neutron-doped (NTD) silicon brings in the manufacture of power semiconductor components are lost with the restriction to a p-doped starting material having n-epitaxial layers.

Another possibility for achieving an n-channel MCT which manages without epitaxial substrate material is known from the publication cited in the introduction (FIG. 1b). Here, n-doped NTD silicon can be used for the production.

The structure requires, however, a considerable amount of space. The advantage of the higher channel mobility over the p-channel MCT cannot therefore be fully exhausted. On the contrary, approximately the same current levels which can be switched off as a maximum were found experimentally for both types of MCT.

An increase in the current level which can be switched off as a maximum, which increase is desirable for reasons of minimising the drive power, can be achieved in the case of the n-channel MCT by reducing the resistance in the short-circuit path of the MCT.

The dominant component in said short-circuit path is, however, the channel resistance of the MOSFET structure. Said component can be most effectively reduced by reducing the channel length.

On the other hand, the MOSFET structure in the n-channel MCT from the publication mentioned in the introduction also contains a parasitic bipolar structure which is composed of the n-type emitter layer, the p-type base layer and the additional $n^+$-doped drain region which takes over the function of the collector.

If this parasitic BJT latches up, the gate loses its control action on the inversion channel; the MCT can then no longer be switched off. This process is triggered by those holes which are added inside the p-type base layer beneath the channel of the n-type emitter layer (on this point see: M. Stoisiek et al., Advances in Solid State Physics, vol. 26, pages 361–373, F. Vieweg+Sons, Braunschweig/Wiesbaden 1986)).

SUMMARY OF THE INVENTION

Accordingly, one object of this invention is to provide a novel n-channel MCT which is, on the one hand, free of latch-up problems and, on the other hand, makes possible an increase in the current level which can be switched off as a maximum.

The object is achieved in a thyristor of the type mentioned in the introduction wherein a combined channel-drain region in the form of an n-doped zone is disposed between the source region and the drain contact.

The essence of the invention is to employ an MOSFET structure of the depletion type (depletion MOSFET) instead of the MOSFET structure with inversion channel. In this manner, parasitic BJT structures are avoided.

Since the n-channel MCT according to the invention is consequently free of the latch-up problems mentioned previously, the principle of minimising the channel length can now be applied without restriction in order to increase the current level which can be switched off as a maximum.

According to a preferred exemplary embodiment of the invention, the n-doping of the combined channel-drain region is so chosen that the region can be depleted throughout its entire depth if voltage is applied to the gate electrode.

In this manner, the current flow between source and drain can be completely suppressed so that the short-circuits no longer have any effect.

Further exemplary embodiments emerge from the subclaims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
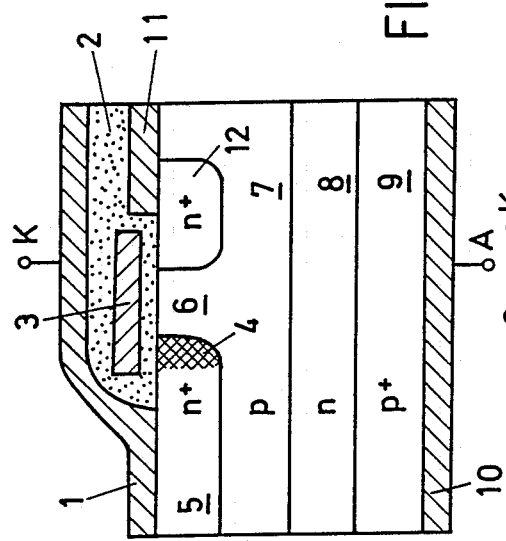
FIG. 1 shows in section the structure of a p-channel MCT according to the prior art.
Figure 2:
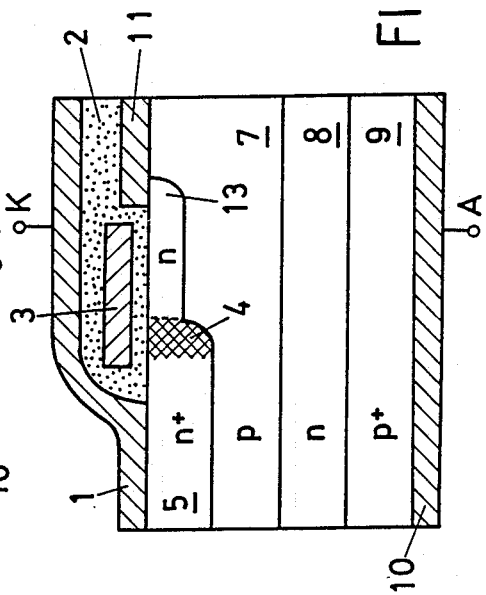
FIG. 2 shows the structure of a first n-channel MCT according to the prior art.
Figure 3:
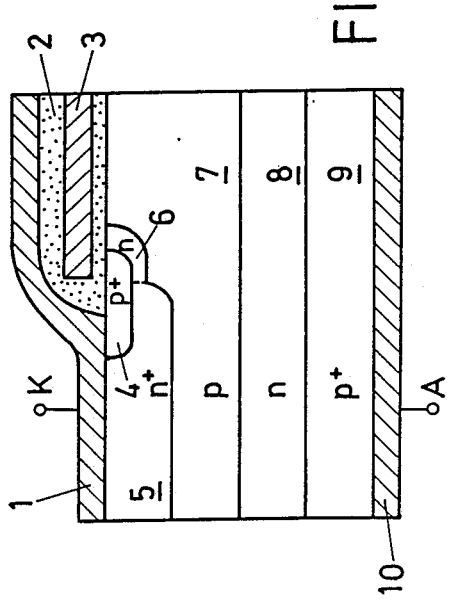
FIG. 3 shows the structure of a second n-channel MCT according to the prior art.

Referring now to the drawings, wherein like reference numerals designate identical or corresponding parts throughout the several views, FIGS. 1 -3 show various known MCT structures in section.

FIG. 1 shows a p-channel MCT which can be produced with n-doped silicon base material, in particular, that is to say, with the preferred NTD silicon.

In this MCT the thyristor structure comprises, between an anode A and a cathode K, a sequence of layers which are composed of a p+-doped p-type emitter layer 9, an n-doped n-type base layer 8, a p-doped p-type base layer 7 and an n+-doped n-type emitter layer 5. The p-type emitter layer 9 is provided with an anode contact 10 and the n-type emitter layer 5 with a cathode contact 1.

The controllable cathode short-circuit between the p-type base layer 7 and the cathode contact 1 is formed by an MOSFET structure which is composed of a p+-doped source region 4, an n-doped channel region 6, the part of the p-type base layer 7 which emerges at the substrate surface and a gate electrode 3 situated above it. The gate electrode 3 is electrically insulated at the same time by a gate insulation 2 from the substrate and from the cathode contact 1.

If a suitable voltage is now applied to the gate electrode 3, a p-type inversion channel which conductively connects the p-type base layer 7 to the cathode contact 1 forms in the channel region 6 at the substrate surface. In this case, each of the cathode short-circuits is therefore operative.

If no voltage is applied to the gate electrode 3, the cathode short-circuits are inoperative and the component exhibits the behaviour of a normal thyristor structure. For further details of the mode of operation, reference is made to the publications cited.

As already mentioned in the introduction, in relation to the current level which can be switched off as a maximum, it is more beneficial to employ an n-channel MCT instead of a p-channel MCT.

A first known possibility for achieving such an n-channel MCT is to build up the MCT in a structure complementary to FIG. 1, i.e. to interchange the p-doped and n-doped layers and regions.

Such an n-channel MCT complementary to the p-channel MCT of FIG. 1 is shown in FIG. 2. The arrangement and mode of operation of this MCT are analogous, with the difference that anode and cathode are interchanged and the inversion channel is now an n-channel.

Whereas, however, an n-doped substrate material into which the layers 7, 9 and 5 can be driven in in sequence can be used in the case of the p-channel MCT of FIG. 1, in the case of the n-channel MCT of FIG. 2 recourse has to be made to an epitaxial build-up of the layer sequence, and this is technologically substantially more expensive and results in the desired homogeneity only with difficulty.

It has therefore already been proposed to build up the n-channel MCT in a manner such that an n-doped starting material can also be used in this case. The proposed structure is shown in FIG. 3.

The MOSFET structure necessary to control the cathode short-circuits comprises, in this n-channel MCT, an n+-doped source region 4 which is part of the n-type emitter layer 5, a channel region 6 which is part of the p-type base layer 7, an n+-doped drain region 12 and the gate electrode 3 situated on top of it.

The p-type base layer 7 is connected to the drain region 12 via a drain contact 11 and is short-circuited with the cathode contact 1 if a suitable voltage produces an n-type inversion channel at the gate electrode 3 in the channel region 6.

In this known MCT structure, however, two problems occur: On the one hand, the n-type emitter layer, the p-type base layer 7 outside the channel region 6 and the drain region 12 form a parasitic bipolar npn transistor structure which results, under certain circumstances, in a latch-up and, consequently, in loss of controlability for the short-circuits. The channel region 6 should therefore be chosen as wide as possible in order to keep the effect of this parasitic structure small.

On the other hand, however, a large width of the channel region 6 means high channel resistance which has a limiting effect on the current level which can be switched off as a maximum.

Figure 4:
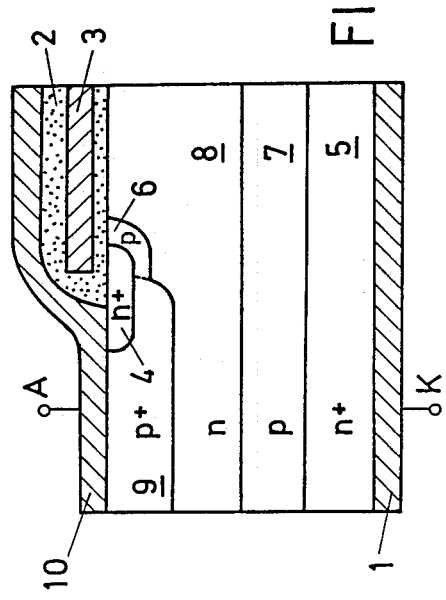
FIG. 4 shows the structure of an improved n-channel MCT according to an exemplary embodiment of the invention.

In order to resolve this dilemma, according to the invention, it is now proposed to dispose, between the drain contact 11 and the n-type emitter layer 5, an n-doped combined channel-drain region 13 which replaces the channel region 6 and the drain region 13 (FIG. 4).

This combined channel-drain region 13 converts the MOSFET structure from the enhancement type (enhancement FET) into a depletion type (depletion FET).

The consequence of this conversion is that the MOSFET control is no longer impaired by a parasitic bipolar structure. Accordingly, the channel length can now be chosen as small as possible so that the potential of the n-channel MCT in relation to the current level which can be switched off as a maximum can be fully exhausted.

In the proposed structure (FIG. 4), the peripheral region of the n-type emitter layer 5 furthermore has the function of the source region 4. The channel and drain region is composed of the n-doped combined channel-drain region 13. The insulated gate electrode 13 is situated over a part of this region.

The conductivity of the combined channel-drain region 13 can be varied within wide limits via the gate potential. The doping of this region is, at the same time, preferably so chosen that the region can be depleted throughout its entire depth.

No current flow then takes place between source and drain and the MOSFET structure is non-conducting. This state is achieved with the typical materials for gate electrode (polysilicon) and gate insulation ($SiO_2$) at a negative gate voltage with respect to the n-type emitter layer 5.

The mode of operation of the MOSFET structure consequently corresponds, as already mentioned several times, to that of an n-channel MOSFET of the depletion type (on this point see: C. Turchetti et al., IEEE Trans. Electron Dev., ED-32, pages 773–782 (1985)). Accordingly, the channel has a good conductivity with a gate voltage of 0 V with respect to the n-type emitter layer 5. This can be substantially increased by increasing the gate voltage to positive values, and this benefits the effectiveness of the short-circuits.

In the proposed structure, the $n^+$-doping of the drain region is dispensed with. Since the doping of the combined channel-drain region 13 is preferably in the region of $10^{17}$ $cm^{-3}$, acceptable contact properties can be achieved even with direct metallisation (for the drain contact 11).

According to another exemplary embodiment of the invention, the drain contact 11 can also be deposited as a metal silicide layer on the substrate so that the contact on n-type silicon then acquires the properties of a Schottky barrier. Details of this type of contacting can be obtained from a paper by S.E. Swirhun et al., IEEE Trans. Electron Dev., ED-32, pages 194–202 (1985).

In total, the structure according to the invention provides an n-channel MCT which does not suffer from any latch-up problems and at the same time can easily be optimised in relation to the current level which can be switched off as a maximum.

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by Letters Patent of the United States is:

1. An MOS-controlled thyristor (MCT) with an anode and a cathode, comprising:
   a sequence of alternatively doped layers comprising a p-type emitter layer, an n-type base layer, a p-type base layer and an n-type emitter-layer provided between said anode and said cathode;
   a plurality of cathode shorts which can be controlled via a MOSFET structure provided on the side of said cathode, said MOSFET structure having a source region and a combined channel-drain region having a channel and a drain portion, all being n-type, and an insulated gate electrode covering said channel portion, said MOSFET structure short-circuiting said p-type base layer to a cathode contact in the switched-on state; wherein
   said p-type base layer is connected to said drain portion via a drain contact,
   said source region is a part of said n-type emitter layer which is connected to said cathode contact,
   said channel portion and said drain portion have the same depth and doping concentration, and said combined region is disposed between said source region and said drain contact.

2. The thyristor as claimed in claim 1, wherein the n-doping of the combined channel-drain region (13) is so chosen that the region can be depleted throughout its entire depth if voltage is applied to the gate electrode (3).

3. The thyristor as claimed in claim 2, wherein the n-doping of the combined channel-drain region (13) is in the region of concentration of $10^{17}$ $cm^{-3}$.

4. The thyristor as claimed in claim 1, wherein the drain contact (11) is composed of a silicide.

* * * * *